United States Patent
Tully et al.

(10) Patent No.: US 12,297,557 B2
(45) Date of Patent: May 13, 2025

(54) METHOD FOR FORMING DIAMOND PRODUCT

(71) Applicants: Element Six Technologies Limited, Didcot (GB); University of Warwick, Coventry (GB)

(72) Inventors: Joshua James Tully, Coventry (GB); Samuel James Cobb, Coventry (GB); Julie Victoria MacPherson, Coventry (GB); Mark Edward Newton, Coventry (GB); Matthew Lee Markham, Didcot (GB)

(73) Assignees: ELEMENT SIX TECHNOLOGIES LIMITED, Didcot (GB); UNIVERSITY OF WARWICK, Coventry (GB)

( * ) Notice: Subject to any disclaimer, the term of this patent is extended or adjusted under 35 U.S.C. 154(b) by 223 days.

(21) Appl. No.: 17/759,173

(22) PCT Filed: Mar. 4, 2021

(86) PCT No.: PCT/EP2021/055513
§ 371 (c)(1),
(2) Date: Jul. 20, 2022

(87) PCT Pub. No.: WO2021/176015
PCT Pub. Date: Sep. 10, 2021

(65) Prior Publication Data
US 2023/0053780 A1    Feb. 23, 2023

(30) Foreign Application Priority Data

Mar. 6, 2020   (GB) ..................... 2003310

(51) Int. Cl.
*C25F 3/12* (2006.01)
*C01B 32/25* (2017.01)
(Continued)

(52) U.S. Cl.
CPC ............. *C25F 3/12* (2013.01); *C01B 32/25* (2017.08); *C01B 32/28* (2017.08);
(Continued)

(58) Field of Classification Search
CPC ............ C25F 3/12; C30B 29/04; C30B 33/10
(Continued)

(56) References Cited

U.S. PATENT DOCUMENTS

| 5,891,575 A | 4/1999 | Marchywka et al. |
| 2005/0064352 A1* | 3/2005 | Suzuki ............... G03C 1/49854 430/619 |

(Continued)

FOREIGN PATENT DOCUMENTS

| CN | 106661759 A | 5/2017 |
| EP | 2058419 A1 | 5/2009 |

(Continued)

OTHER PUBLICATIONS

Machine_english_translation_JP_2011195407_A; Ikeda at. al.; Method and Apparatus for Peeling Diamond; Oct. 6, 2011; EPO; whole document (Year: 2024).*

(Continued)

*Primary Examiner* — Tahseen Khan
(74) *Attorney, Agent, or Firm* — Kilpatrick Townsend & Stockton LLP

(57) ABSTRACT

A method for forming a diamond product. Diamond material is provided and a damage layer comprising $sp^2$ bonded carbon is formed in the material. The presence of the damage layer defines a first diamond layer above and in contact with the damage layer and a second diamond layer below and in contact with the damage layer. The damage layer is electrochemically etched to separate it from the first layer, wherein the electrochemical etching is performed in a solution containing ions, the solution having an electrical con- (Continued)

ductivity of at least 500 µS cm$^{-1}$, and wherein the ions are capable of forming radicals during electrolysis. The diamond product is also described.

20 Claims, 6 Drawing Sheets

(51) Int. Cl.
| | |
|---|---|
| C01B 32/28 | (2017.01) |
| C23C 14/06 | (2006.01) |
| C23C 14/48 | (2006.01) |
| C25F 3/14 | (2006.01) |
| C30B 29/04 | (2006.01) |
| C30B 33/10 | (2006.01) |

(52) U.S. Cl.
CPC .......... *C23C 14/0605* (2013.01); *C23C 14/48* (2013.01); *C25F 3/14* (2013.01); *C30B 29/04* (2013.01); *C30B 33/10* (2013.01); *C01P 2002/90* (2013.01)

(58) Field of Classification Search
USPC ........................................ 428/220
See application file for complete search history.

(56) References Cited

U.S. PATENT DOCUMENTS

| | | |
|---|---|---|
| 2010/0294196 A1 | 11/2010 | Noguchi |
| 2013/0043213 A1 | 2/2013 | Liao et al. |
| 2017/0233890 A1 | 8/2017 | Nishibayashi et al. |

FOREIGN PATENT DOCUMENTS

| | | | |
|---|---|---|---|
| JP | 2011195407 A | * | 10/2011 |
| JP | 2011195411 A | | 10/2011 |
| JP | 2012051793 A | | 3/2012 |
| JP | 2013159513 A | | 8/2013 |
| WO | 2016058037 A1 | | 4/2016 |

OTHER PUBLICATIONS

Parikh et. al., "Single-crystal diamond plate liftoff achieved by ion implantation and subsequent annealing", Appl. Phys. Lett., Dec. 28, 1992, pp. 3124-3126, vol. 61, No. 26, American Institute of Physics.
Marchywka et al., "Electrochemical Patterning of Amorphous Carbon on Diamond", J. Electrochem. Soc., Feb. 1993, pp. L19-L22, vol. 140, No. 2, The Electrochemical Society, Inc.
Piracha et al., Scalable fabrication of high-quality, ultra-thin single crystal diamond membrane windows, Nanoscale, 2016, pp. 6860-6865, vol. 8, The Royal Society of Chemistry.
Ziegler et al., "SRIM—The stopping and range of ions in matter", Nuclear Instruments and Methods in Physics Research B, 2010, pp. 1818-1823, vol. 268, No. 11-12, Elsevier.
Stoll et al., "EasySpin, a comprehensive software package for spectral simulation and analysis in EPR", Journal of Magnetic Resonance, 2006, pp. 42-55, vol. 178, No. 1, Elsevier.
Wang et al., "Fabrication of suspended single crystal diamond devices by electrochemical etch", Journal of Vacuum Science and Technology: Part B, May/Jun. 2007, pp. 730-733, vol. 25, No. 3, American Vacuum Society.
Widiez et al., "Fabrication of Silicon on Diamond (SOD) substrates by either the Bonded and Etched-back SOI (BESOI) or the Smart-Cut technology", Solid-State Electronics, Feb. 1, 2010, pp. 158-163, vol. 54, No. 2, Elsevier.
United Kingdom Patent Application No. GB2003310.6, Combined Search and Examination Report dated Sep. 8, 2020, 7 pages.
International Patent Application No. PCT/EP2021/055513, International Search Report and Written Opinion dated Jun. 21, 2021, 13 pages.
United Kingdom Patent Application No. GB2103069.7, Combined Search and Examination Report dated Sep. 7, 2021, 7 pages.

* cited by examiner

METHOD FOR FORMING DIAMOND PRODUCT

BACKGROUND

The present invention relates to a method for forming diamond products, in particular thin diamond material and/or membranes

INTRODUCTION

Thin (sub-micron) diamond membranes have applications in emerging optical and quantum electronic devices, however production of these thin films by conventional means is incredibly difficult.

Commercially available diamond plates currently have a thickness in the range from around 5 μm to several millimetres. To achieve this thickness, these plates are mechanically polished using a diamond abrasive. It is extremely challenging to polish any thinner than the lower limit, due to the hardness of diamond, and even at these achievable thicknesses the diamond is wedge shaped, with the thickness varying across the sample. This sample roughness and non-uniformity limits how thin the membrane can be made, ultimately resulting in a higher than desirable average membrane thickness, limiting its use for quantum applications.

Moreover, due to the extreme hardness of diamond, abrasive polishing often results in sub-surface damage to the diamond, which requires further processing steps if the material is being prepared for quantum applications. While this may not be hugely problematic for bulk diamonds, for thin membranes in e.g. photonics applications it is far from desirable, as it reduces both the strength and optical clarity of the diamond. Although this damage can be reduced using other methods such as chemically assisted polishing, it cannot be prevented entirely.

One technique used to achieve the desired sub-micron thicknesses is Reactive Ion Etching (RIE). RIE is a dry etching technique that uses a chemically reactive plasma to remove material from the surface of the diamond. However, RIE is a slow process, typically etching at a rate of 10s of nm an hour. Consequently, it is only feasible for samples which have a thickness which is already in the micron range. RIE etching is essentially isotropic, meaning that the final morphology is determined by the starting surface. As a result, applying RIE to wedge-shaped polished diamond will result in a thinner surface but will not resolve the variable thickness.

Work by Parikh et.al. (Appl. Phys. Lett. 1992, 61 (26), 3124-3126) has shown that a combination of ion implantation and etching (either wet or dry) can be used to produce thin, uniform diamond membranes. This approach involves ion implantation of the diamond, to create a damaged layer within the diamond, where the ions come to rest, which is at a depth dependent on the energy used. This implantation is followed by annealing at 950° C. for 30 minutes, during which this end of range damage layer becomes graphitic in nature. This graphitic layer can then be removed using either a wet etch consisting of hot chromic-sulphuric acid, or a dry etch by annealing at 550° C. under oxygen. Both removal techniques free the thin layer of diamond above the graphitic layer. The chief advantage of this technique is that the ion implantation step creates an etch-able layer at a controlled and fixed distance beneath the surface, ensuring a membrane of uniform thickness, even if the two faces of the substrate have not been polished parallel. If a thicker or higher quality diamond layer is required, the substrate can have an additional diamond layer grown on top of it before the electrochemical etch and lift off takes place. If desired the diamond from the original substrate can then be removed by RIE etching, so that only the higher quality overgrown material remains.

Marchywka et al. (Appl. Phys. Lett. 63, 3521 (1993)) have shown that similar membranes can be achieved by using an electrochemical etch, instead of a chemical etch, to remove the graphitic layer. Here the sample was placed between platinum electrodes, spaced 2 cm apart, and immersed 1 cm deep in distilled water with sufficient chromic acid added to allow only 100 mA of current flow with 200 V applied bias. This voltage was then applied until full separation of the membrane was achieved. However, under these conditions the etch rate was extremely slow, taking 10 hours to separate a 3×3 mm membrane. This gives an approximate area etch rate of material removal of 0.9 $mm^2 hr^{-1}$.

In a following piece of work (J. Electrochem. Soc., 140, 2, (1993)) the same authors advocate specifically for the use of high resistivity media, believing that in a true bipolar arrangement this would cause a larger portion of the current to flow through the graphite layer implanted within the diamond, therefore increasing the etch rate.

In a more recent piece of work by Parikh et. al. (Nanoscale, 2016, 8, 6860) the authors implanted with 1 MeV helium, before annealing at 1300° C. The authors reported an area electrochemical etch rate of 0.25 $mm^2 hr^{-1}$ when using a solution of saturated boric acid mixed equally with deionised water. Little explanation is given for the choice of boric acid as an electrolyte. When this experiment was replicated using a 3.5×3.5 mm HPHT substrate, implanted with 2 MeV Carbon, as more fully described in the diamond sample preparation section, the rate was found to be slightly higher (0.8±0.04 $mm^2 hr^{-1}$).

In addition to producing thin membranes, such processes where implantation is followed by a lift off technique have applications for a number of diamond processing procedures. These include the fabrication of microscale suspended single crystal devices, which require structures difficult to fabricate by conventional means in diamond. Such processes are also useful in the separation of homoepitaxial CVD diamonds from their growth substrates. In particular, growth of high-quality single crystal diamond requires the use of a high-quality diamond substrate to seed its growth. However, removal of this substrate is difficult, due to the hardness of diamonds and results in loss of material. Using a lift-off technique to remove the diamond from the substrate after implantation is a promising way to mitigate this issue.

Although the implantation and lift-off technique has been investigated for many different applications, the etching process is little understood. A small number of etch solutions and electrolytes, such as boric acid, chromic acid and tap water have been used in the literature and the common factor for all these studies is the etch rate is very slow. U.S. Pat. No. 5,891,575A also describes a number of etch solutions, and emphasizes that these should be used in a regime where 1-100 nA $cm^{-2}$ of current flows at 50-300 V of applied potential, indicative of very low conductivity solutions.

There is a need for an improved process wherein the etch speed is increased and so the separation time is decreased.

SUMMARY

It is clear that there is a need for an improved process for producing thin diamond layers which have a thickness which makes them suitable for use in optical and electronic devices.

Against this background, according to a first aspect, there is provided a method for forming a diamond product comprising:

providing a diamond material;

forming a damage layer comprising $sp^2$ bonded carbon, wherein the presence of the damage layer defines a first diamond layer above and in contact with the damage layer and a second diamond layer below and in contact with the damage layer; and electrochemically etching the damage layer to separate therefrom the first diamond layer, wherein the electrochemical etching is performed in a solution containing ions, the solution having an electrical conductivity of at least 500 μS $cm^{-1}$, and wherein the ions are capable of forming radical species during electrolysis.

More specifically, the inventors have surprisingly found that the selection and concentration of etchant in the step in which the damage layer is electrochemically etched is critical to ensuring a high etch rate, in particularly a suitably high conductivity (for example above 500 μS $cm^{-1}$) and appropriate chemical identity of the solution. This is in contrast to previous work, which advocated for just high resistivity media (J. Electrochem. Soc., 140, 2, (1993)), giving no consideration to the chemistries employed. A key aspect of this lies in the ability of the ions to form radical species under applied potentials, with etchants that produce a greater number of, or more highly oxidising radicals resulting in a higher etch rate.

It is also in direct contrast to the teachings of U.S. Pat. No. 5,891,575A, which describes conditions in which the solution has the electrical conductivity of deionised water (0.5 μS cm) i.e., are very resistive. In order to match this conductivity with a dilute solution of $H_2SO_4$, as suggested in U.S. Pat. No. 5,891,575A, the solution would have to be made at a concentration of ca. 100 nM.

If the correct ions are selected, there is a significant increase in the etch rate as compared to known electrochemical etching processes. In particular, the inventors have observed bulk etching rates which are over an order of magnitude faster than the rates that can be achieved with published methods. This is advantageous because it significantly reduces production times and hence costs.

The term "damage layer" is used herein to refer to a layer of carbon which has a crystallographic structure which differs from that of the surrounding diamond material. The term "layer" is used to define a region which extends substantially from one face of the diamond material to another face, as compared to forming isolated regions within the diamond material. However, it will be appreciated that there may be minor discontinuities in the layer and/or that the damage layer may not be completely exposed at the faces of the diamond material. However, in order for electrochemical etching to be effective, an active etchant species needs to access the damage layer. The damage layer is a layer of predominantly $sp^2$ bonded carbon, as compared to the $sp^a$ bonded carbon structure of diamond.

The presence of the damage layer means that there are two distinct regions within the diamond material; a first diamond layer above and in contact with the damage layer and a crystal diamond layer which is below and in contact with the damage layer.

The dimensions of the diamond material provided in step (a) are not limited. Typically, the diamond material will have a thickness in the range from about 10 to about 1000 μm, preferably in the range from 100 to 500 μm.

The diamond material provided in step (a) may have been produced by a Chemical Vapour Deposition (CVD) process or a High Pressure High Temperature (HPHT) process. Bulk etch rates in HPHT diamond material are generally faster than in CVD diamond material, possibly due to a lower structural defect density.

The electrochemical etch step may be preceded by a step of annealing the diamond material to convert the damaged region into a continuous layer of $sp^2$ bonded carbon.

The diamond material provided may be doped or undoped. Where it is doped, the dopant atoms may create n-type or p-type semiconductors. P-type doping may be achieved by implanting the material with, for example, boron atoms. N-type doping may be achieved by implanting the material with, for example, nitrogen, phosphorus or lithium atoms. Doping can be achieved by ion implantation and the skilled person will be familiar with suitable techniques.

The diamond material provided may be single crystal or polycrystalline. Furthermore, the diamond material provided may be HPHT or CVD diamond material The dimensions of the diamond material are not limited and will depend depending on the end use of the diamond product. Examples of suitable dimensions for single crystal diamond include a largest linear dimension of at least 6 mm, at least 8 mm, at least 10 mm, at least 15 mm and at least 20 mm.

Optionally, the diamond material provided may be polished, in particular mechanically polished prior to forming the damage layer. Where a polishing step is included, preferably the surface of the diamond material through which ions are to be passed is polished to an $R_a$ roughness value selected from less than 100 nm, less than 50 nm, less than 20 nm, and less than 10 nm.

The damage layer may be formed by ion implantation. During ion implantation, an implanted layer is formed below the surface of the diamond material. The skilled person will be familiar with ion implantation techniques. In particular, ion implantation may be effected using a high velocity ion beam. The ion beam is produced from a gaseous plasma, which comprises a mixture of ions and electrons. The ions are separated from the mixture by a small electric field and can then be accelerated and directed towards the diamond material using a stronger electric field and/or magnetic fields. The use of a strong magnetic field makes it possible to select a single ionic species for implantation. Examples of suitable ions include, but are not limited to helium, carbon, nitrogen and boron.

The depth at which the implanted layer is formed within the diamond material will depend on the energy of the ion beam used. Typically, the kinetic energies of suitable ion beams range between $1\times10^4$ to about $1\times10^7$ eV and this provides implanted layers at depths in the range from about 10 nm to about 5 μm. The depth of the implanted layer can be calculated by SRIM Simulations (Stopping Range of Ions in Matter, (Ziegler, J. F. et al., SRIM—The Stopping and Range of Ions in Matter (2010). *Nucl. Instruments Methods Phys. Res. Sect. B Beam Interact. with Mater. Atoms* 2010, 268 (11-12), 1818-1823)). The minimum dose of ions is about $10^{15}$ ions/$cm^2$ and is typically in the range from about $10^{16}$ to about $10^{20}$ ions/$cm^2$. The duration of an ion implantation step is typically in the range from 1 minute to 5 hours, more typically in the range from 2 to 10 minutes, depending on the dosage required. The current of ions and the duration of the step determine how many ions are implanted. An ion implantation step is typically performed under vaccuum. Ion implantation is normally carried out between −200° C. and room temperature, although higher temperatures can be employed.

The ion implantation step creates a damage layer below the surface of the diamond material. The damage layer typically has a thickness in the range from 10 to 1000 nm, preferably in the range from 20 to 500 nm. The thickness of the damage layer can be controlled by adjusting the ion beam energy, the ion current and/or the duration of the ion implantation step.

As described above, the damage layer is a layer of carbon material which has a crystallographic structure which differs from that of the surrounding diamond material. However, it may also contain small amounts of other atoms depending on the ions used during the implantation step. Examples of other atoms which may be present in the damage layer include helium, boron, nitrogen and hydrogen.

After the ion implantation step, the diamond material may be annealed. Annealing the ion implanted diamond material has the effect of converting the damaged region into an $sp^2$ bonded carbon layer.

The annealing step may be carried out at a temperature in the range from 500 to 1500° C., preferably in the range from 1000 to 1400° C. The duration of the annealing step may be in the range from 0.5 to 16 hours. Annealing is performed in an inert atmosphere such as argon or nitrogen or under vacuum, for example at a pressure of less than around 1 Pa.

The product obtained after the annealing step is diamond material which contains a damage layer which comprises $sp^2$ bonded carbon and wherein the presence of the damage layer defines a first diamond layer above and in contact with the damage layer and a second diamond layer below and in contact with the damage layer.

Optionally, an additional step may be included after the ion implantaion step which comprises growing, by a Chemical Vapour Deposition (CVD) process, a layer of diamond on the surface of the diamond material through which the ions were implanted. The thickness of the layer which is grown (hereinafter "the overgrown layer") will depend on the intended end application of the diamond layer produced by the method of the invention. Where the diamond layer produced by the method of the invention is for use in an optical application, preferably the overgrown layer has a thickness in the range from a few nm to about 10 mm. Where the diamond layer produced by the method of the invention is for use in an electronic device, preferably the overgrown layer has a thickness in the range from about 1 nm to about 100 μm.

CVD methods for the deposition of diamond are now well-established and have been described extensively in the patent and other literature. The method generally involves providing a source gas which, on dissociation to form plasma, can provide reactive gas species such as radicals and other reactive species. Dissociation of the source gas is brought about by an energy source such as microwaves, RF energy, a flame, a hot filament or a jet-based technique, and produces reactive gas species which are allowed to deposit onto a substrate and form diamond.

Where this additional step is included, the first diamond layer produced in the diamond material comprises both the portion of the diamond material above the damage layer and the overgrown diamond layer.

Prior to electrochemical etching, the diamond material containing a damage layer may be cleaned. An exemplary cleaning step is in a mixture of concentrated sulfuric acid saturated with potassium nitrate and heated to 200° C. for approximately 30 minutes. This step may then be followed by boiling for between 2 and 30 minutes in sulfuric acid, then washing with ultrapure water.

As noted above, the electrochemical etching step is performed in the presence of ions which generate, through electrolysis, etchant species which selectively etch the $sp^2$ bonded carbon of the layer formed by annealing the damage layer in the diamond material. Examples of suitable ions include any of persulfate ions, sulfate ions, oxalate ions, chloride ions, carbonate ions and metal ions. As an option, the ions may be present during the electrochemical etching at a concentration of between 0.01 M and an upper limit of the solubility of the ions in the electrolyte.

The solution containing the ions optionally has a conductivity of at least 500 μS cm$^{-1}$.

Electrochemical etching is performed in an electrochemical cell which comprises, at least, an anode, a cathode and an electrolyte. The ions described above are present in solution in the electrolyte.

To date, it has been thought that the key consideration for the electrochemical etching process is the resistivity of the electrolyte present in the electrochemical cell. However, the present inventors are the first to identify otherwise. More specifically, as set out in the examples which follow, the inventors investigated performing the etching step in the presence of several different salt solutions as electrolytes and all at higher conductivity than previously published. While all of the solutions tested worked as etching solutions, surprisingly, certain solutions (for a comparable conductivity) performed significantly better than others. Hence, not only did the inventors, find against the published data that low resistivity was preferred, they also showed that the choice of ions is important. In particular, the choice of ions that can form radicals electrochemically. With the exception of potassium nitrate all the electrolytes ($K_2CO_3$, KCl, $K_2C_2O_4$ and $K_2SO_4$) offered improved etch rates over published processes. Such ions contribute to the etching process in a manner beyond simply increasing the conductivity of the etching solution.

The fastest of all the solutions tested contained sulfate ions. The source of sulfate ions is not limited and suitable examples include potassium sulfate ($K_2SO_4$), and other water-soluble sulfate salts such as $Na_2SO_4$.

The nature of the electrochemical cell used in the electrochemical etching step is not limited and the skilled person will be familiar with suitable electrochemical cells. The anode and cathode may be formed from any conducting material. Preferably, the anode and the cathode are formed from the same conducting material. Preferred conducting materials include carbon and precious metals, such as platinum. Preferably, the anode and cathode are formed from platinum. The anode and cathode are positioned spaced apart from each other in a liquid electrolyte. A voltage is then applied between the two electrodes to create an electric field in the electrolyte. The voltage applied is typically in the range from 10 to 300 V.

The electrolyte used is any one in which the source of ions can be dissolved. Examples include dilute sulfuric acid and distilled water. In the case of sulfate ion containing solutions, preferably the electrolyte is acidic. In this regard, the inventors have surprisingly found that where the electrolyte includes a source of protons ($H^+$ ions), there is a further increase in the bulk etching rate. Without wishing to be bound by theory, it is believed that the $H^+$ ions increase the rate at which the sulfate ions interact with the solvent to form OH radicals, which are also active in the etching process. Therefore, advantageously, step (b) is also carried out at an acidic pH, i.e. at a pH of less than about 7, preferably at a pH of less than about 3. In view of the further advantages observed at acidic pH values, it is particularly preferred that the electrolyte comprises dilute sulfuric acid ($H_2SO_4$), thus ensuring an acidic pH while also maximising the concentration of sulfate ions present. This also has the further advantage that in its pure form, sulfuric acid is a liquid that is completely miscible with water and has a high boiling point limiting evaporation, and if solution evaporation occurs, the electrolyte does not leave salt residues.

The diamond material that contains a damage layer is placed in the electrolyte between the anode and the cathode in a non-contact arrangement. Preferably, it is positioned so that the faces at which the damage layer is exposed (or in closest proximity to the surface thereof) are approximately parallel to the electrodes. The $sp^2$ bonded carbon layer forms a "channel" through which the active etchant species produced as a consequence of the presence of the active ions in the electrolyte pass and, in doing so, convert the $sp^2$ bonded carbon layer to small carbon-containing molecules such as $CO_2$ and $CH_4$. Removal of the non-diamond carbon results in separation of the first diamond layer from the damage layer thus providing a diamond product as described above.

The bulk etch rate of the damage layer can be monitored using transmission microscope imaging. For example, a digital US microscope (Veho Discovery VMS-001, 20-90× magnification) may be used to capture time lapse images as the electrochemical etching step progresses. An exemplary illustration of such time lapse images is shown in FIG. 1. This time lapse data can then be analysed using a MATLAB script. In particular, a region of interest is defined on the first image and the script then calculates the proportion of that area which corresponds to brighter etched regions which match RGB values in the script. This proportion is then converted to an area etched, which can then be plotted as a function of time to create etch profiles. Using this technique produces etch profiles with a time resolution of typically 1 to 10 seconds which can be used to accurately track the progress and rate of etching.

The etch profiles typically have a sigmoidal shape which, as illustrated in FIG. 2, can be divided into three distinct sections: i) the induction region during which very little etching takes place; ii) the bulk etching region during which the rate of etching is highest and the majority of material is removed; and iii) the high volume limit, during which the limited amount of material remaining leads to a decrease in rate, eventually reaching a limit where the amount of etching is negligible. In the majority of cases, this limit is when no more material remains and eventually the etching rate slows to zero as no (or a negligible amount) of $sp^2$ bonded carbon material remains. For the purposes of calculating bulk etch rates, the bulk etching region ii) is assumed to be linear and the bulk etch rate is determined as the gradient of this region.

Using the method of the present invention, bulk etch rates in the range from 2 to 40 $mm^2$ $hr^{-1}$ were observed.

Depending on its end application, the first diamond layer may be very thin and so challenging to manipulate. However, the skilled person will be familiar with techniques for handling such thin material. For example, one approach is to float the first diamond layer off the second diamond layer in distilled water. The first diamond layer can then be floated onto a different substrate and the water under the membrane removed with a tissue, to provide a semi-permanent Van de Waals bond to the new substrate. An alternative approach is to attach the first diamond layer to a pre-grown diamond frame using an adhesive (e.g. a cyanoacrylate adhesive). This can be done either before or after step (b). Once step (b) has been carried out, the frame can be used to manipulate the diamond product without risk of damage.

The dimensions of the diamond product are not limited. However, an advantage of the method of the present invention is that the increased speed of the electrochemical removal allows separation of larger plates, before the process becomes impractically slow.

In a further aspect, the present invention provides a diamond product obtainable by the method described herein.

In a further aspect, the present invention provides use of a diamond product obtainable by the method described herein in an optical product.

In a further aspect, the present invention provides use of a diamond product obtainable by the method described herein in an electronic product.

In a yet further aspect, the present invention provides use of a diamond product obtainable by the method described herein in an electrochemical product.

In a further aspect, there is provided a diamond product comprising polycrystalline diamond material, wherein the diamond product has an average thickness of no greater than 30 μm and the polycrystalline diamond material has an average lateral grain size as measured by scanning electron microscope imaging of no more than 5 μm. This combination of average thickness and average lateral grain size is made possible by the techniques described above in the first aspect.

As an option, the average lateral grain size is selected from any of greater than 10 μm, greater than 15 μm, and greater than 20 μm.

According to a further aspect, there is provided a composite body comprising a single crystal diamond plate having an average thickness of no more than 50 μm, and a support structure attached to a surface of the single crystal diamond plate by a glue that is substantially inert to ions capable of forming radicals during electrolysis. The glue optionally comprises an epoxy. The single crystal diamond plate optionally has an average thickness selected from any of no more than 25 μm, no more than 10 μm, no more than 5 μm and no more than 1 μm.

The present invention will now be described further by reference to the following figures and examples, which are in no way limiting on the scope of the claims.

DETAILED DESCRIPTION

Materials and solutions

All solutions were prepared from Milli-Q water (Millipore Corp.) with a resistivity of 18.2 MΩ cm at 25° C.

The electrolytes used comprised 0.25M salt in DI water. The salts tested were Potassium Nitrate ($KNO_3$, 99.97%, Sigma Aldrich, UK), Potassium Chloride (KCl, ≥99%, Sigma Aldrich, UK), Potassium Sulphate ($K_2SO_4$, Pure, Acros Organics, US), Potassium Carbonate ($K_2CO_3$, ACS reagent, Sigma Aldrich, UK), and Potassium Oxalate ($K_2C_2O_4$, >98.5%, Sigma Aldrich, UK).

Sulphuric Acid ($H_2SO_4$, >96%, Merck, UK) was used at 0.3% v/v (0.05 M) in DI water.

Diamond Sample Preparation

CVD and HPHT single crystal diamond plates (Element Six Technologies Ltd., Harwell, UK) having a thickness of approximately 500 μm were used as the diamond material for all studies, unless otherwise stated. The front face of each sample was mechanically polished to ~nm roughness, and the rear face lapped to ~μm roughness. The polished face was then implanted (Ion Beam Centre, University of Surrey, UK) with $2\times10^{16}$ carbon atoms (2 MeV) per square centimetre, to produce an end of range damage layer ~500 nm below the surface, as calculated by SRIM Simulations.

Implanted samples were then annealed at 1300° C. for two hours, to convert the damage layer generated by ion implantation to a $sp^2$ bonded carbon layer.

Figure 1:
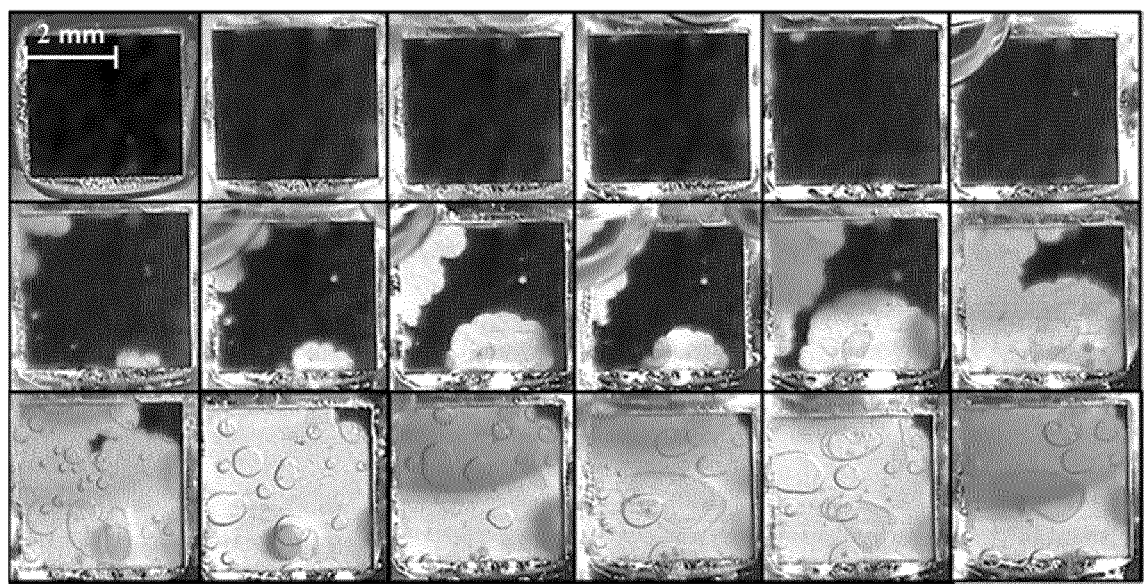
FIG. 1 is a visual representation of the electrochemical etch process of an HPHT single crystal diamond material from t=0 to t=120 minutes. Each image is separated by approximately 8 minutes of etching in 0.3% v/v (0.05 M) $H_2SO_4$.
Figure 2:
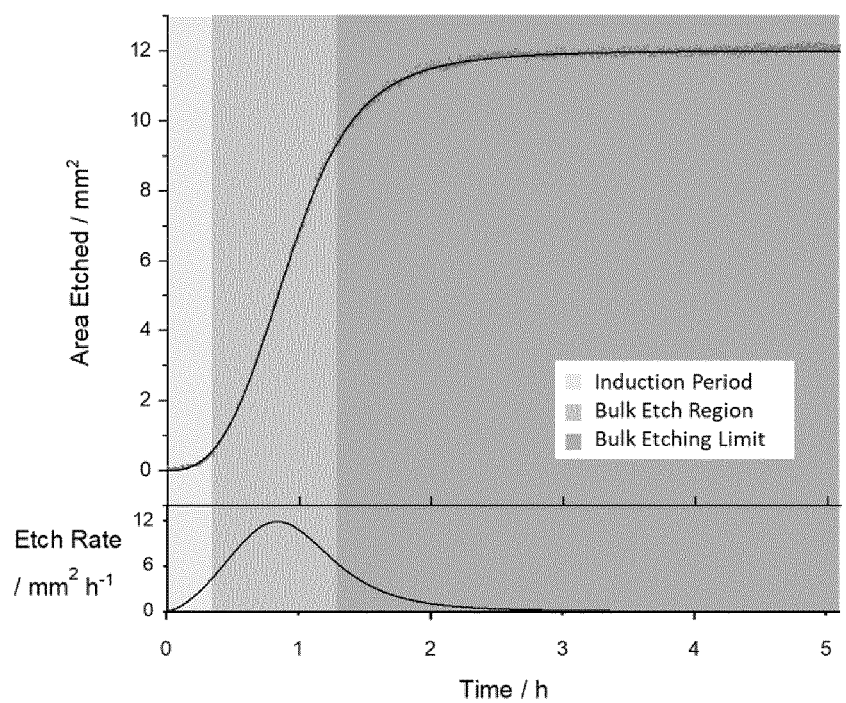
FIG. 2 is an exemplary etch profile from in-situ transmission microscope imaging in a 4.1 mm CVD sample in 0.25 M solution of $K_2SO_4$.

The data shown in FIG. 2 was collected using a 3.5×3.5 mm square CVD plate.

Figure 4:
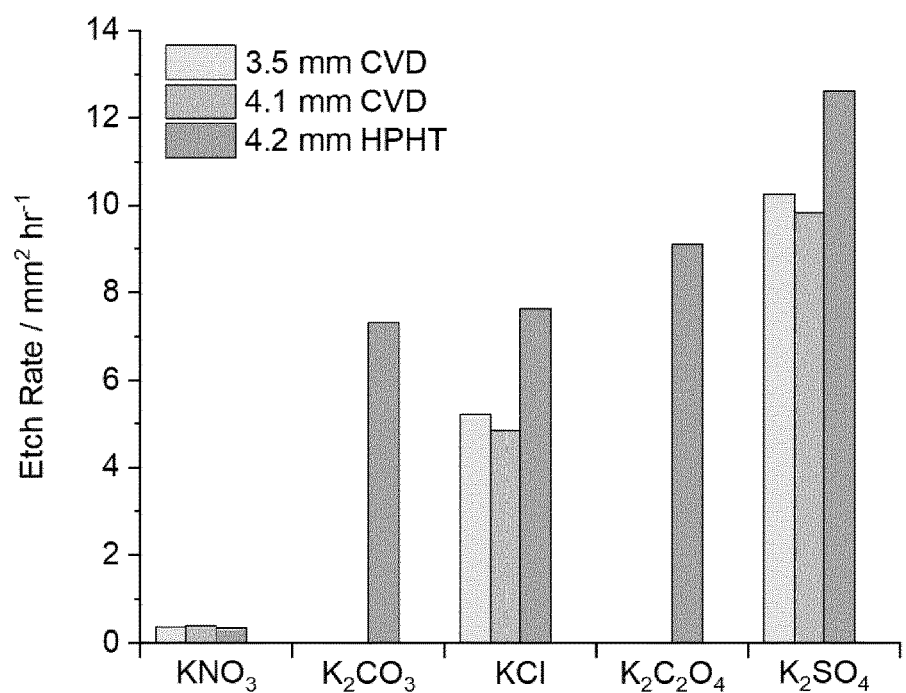
FIG. 4 is a comparison of bulk etch rates of different diamond materials in 0.25M solutions of supporting electrolytes as described in Example 1.

The data shown in FIG. 4 was collected using 3.5 and 4.1 mm square CVD plates, as well as 4.2 mm square HPHT plates.

Figure 5:
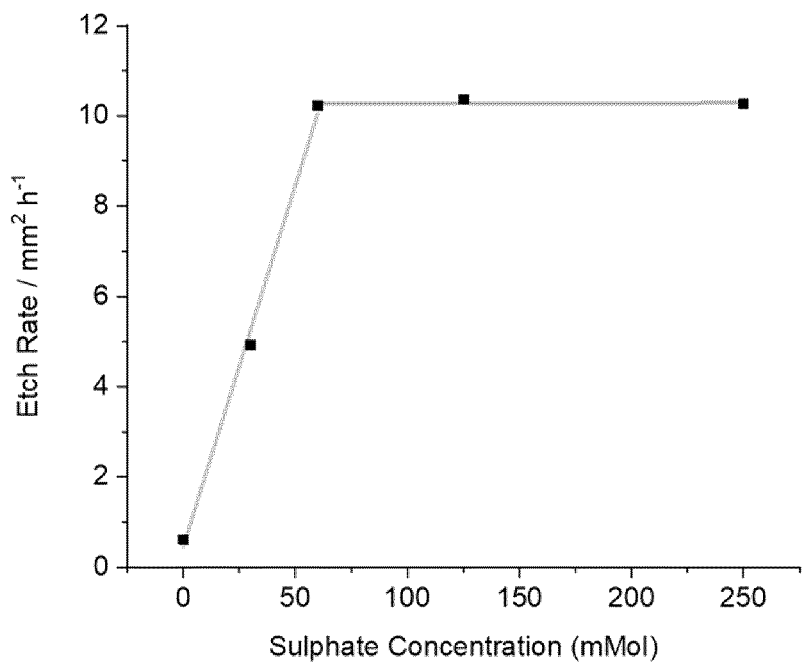
FIG. 5 is a plot of bulk etch rate versus sulfate concentration for a 3.5 mm CVD single crystal diamond material as described in Example 3.

The data shown in FIG. 5 was collected using 3.5 mm square CVD plates.

Figure 6:
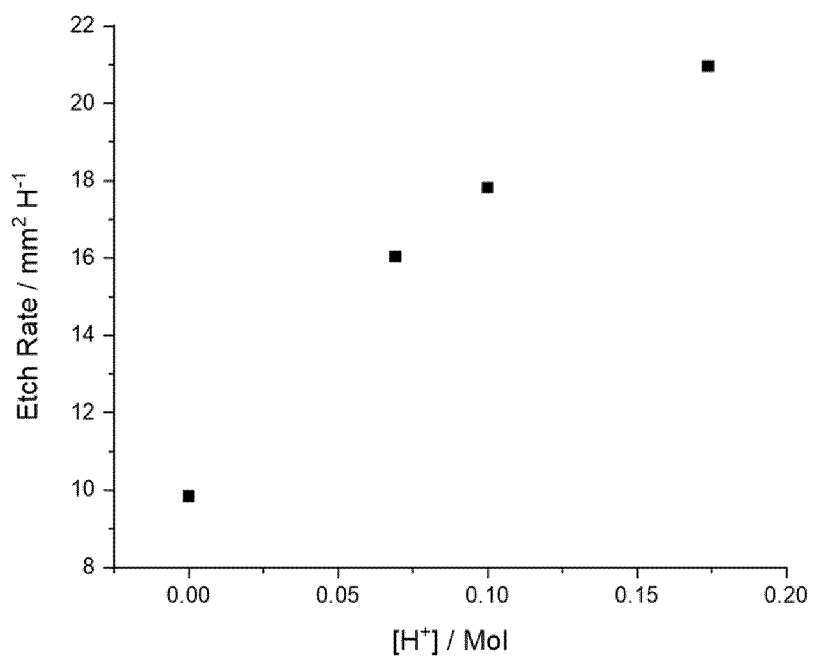
FIG. 6 is a graph showing the bulk etch rates for a 4.1 mm CVD single crystal diamond material in solutions comprised of $K_2SO_4$ and $H_2SO_4$, with constant sulfate concentrate but decreasing pH.

The data shown in FIG. 6 was collected using 4.1 mm square CVD plates.

Figure 8:
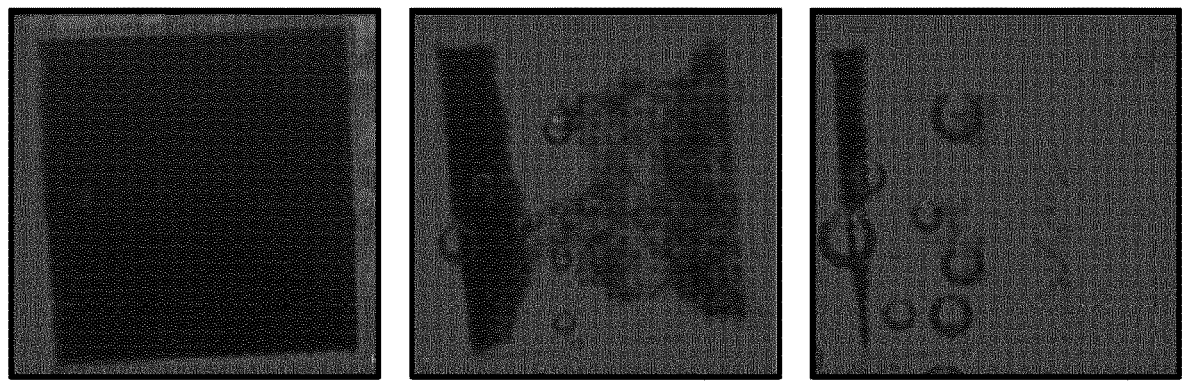
FIG. 8 is microscope images of the etching of optical grade polycrystalline diamond. Each image is separated by 25 minutes of etching from t=0, as described in Example 5.

The data shown in FIG. 8 was collected using a 5 mm square BDD CVD plate.

Implant Characterisation

A Stopping and Range of Ions in Matter (SRIM) simulation was used to calculate the approximate depth and width of the end-of-range damage layer from ion implantation, giving each sample a damage region with a thickness of around 1 μm.

Acid Cleaning

Acid cleaning of diamond samples was carried out in a mixture of concentrated $H_2SO_4$ (Merck, >96%) saturated with $KNO_3$ and heated (200° C.) for 30 minutes. This was followed by another 30 minutes in $H_2SO_4$ at 200° C. and then washing in ultrapure water (>18 MΩ cm, Millipore corp.).

Electrochemical Cell

The electrochemical etching step (b) took place in a custom designed 3D printed cell (Lulzbot Taz 6). This cell was designed to allow positive alignment of the diamond material comprising a damage layer and electrodes and to provide a light path for transmission imaging of samples undergoing etching (FIGS. 3(a) and (b)).

Figure 3:
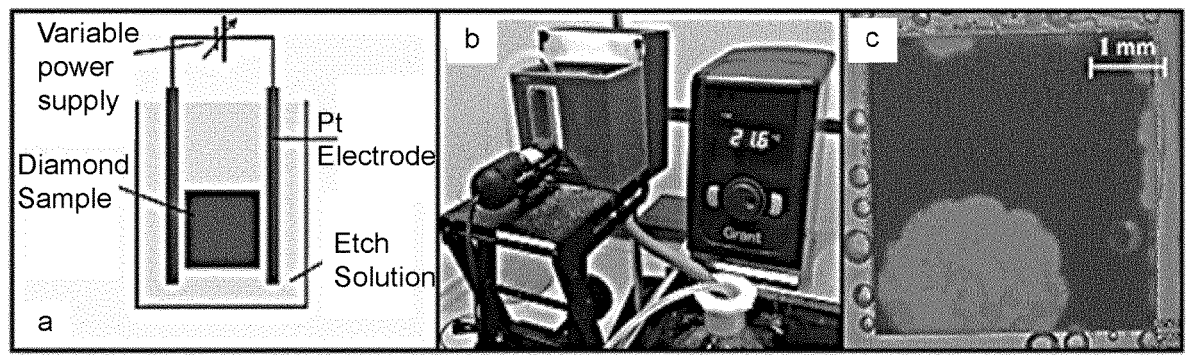
FIG. 3(a) is a schematic of an electrochemical cell used in step (b) showing the arrangement of the diamond material and the electrodes.
FIG. 3(b) is a photograph of the apparatus used in step (b) showing the microscope camera, flow system and backlight.
FIG. 3(c) is an image captured from the microscope camera during etching.

A digital USB microscope (Veho Discovery VMS-001, 20-90× Magnification) was used to capture time lapse images of etch progress (FIG. 3(c)). Unless otherwise stated the electrodes used were 2 cm of 0.75 mm diameter platinum wire (for a total area of 0.5 $cm^2$), with a spacing of 6 mm. A variable DC power supply (Elektro-Automatik GmbH, EA-PS 9750-04) was used to apply a potential between the two electrodes, operating in a potential limiting mode at 30 V, with a current dependent on the solution composition. To maintain constant solution composition and temperature, a flow system was used with a temperature-controlled reservoir of between 5-90° C. Electrolyte was circulated from this reservoir into the cell and returned via an outflow.

Image Analysis

A MATLAB script was used to analyse all time lapse data. Each frame from the video capture was extracted. The region of interest is defined on the first image and the script then calculates what proportion of that area corresponds to brighter etched regions, which match RGB values in the script. This proportion is then converted to an area, which is then plotted versus the etch time, to create etch profiles. Etch rates are compared in Table 1.

TABLE 1

Etch Rate Comparison

| Solution | Substrate | Etch Rate ($mm^2$ $hr^{-1}$) |
|---|---|---|
| ½ Saturated Boric Acid | 3.5 mm square HPHT FIG. 4 | 0.8 ± 0.04 (n = 3) |
| 0.25M $KNO_3$ | 3.5 mm square CVD | 0.36 |
| 0.25M $KNO_3$ | 4.1 mm square CVD | 0.40 |
| 0.25M $KNO_3$ | 4.2 mm square HPHT | 0.34 |
| 0.25M $K_2CO_3$ | 4.2 mm square HPHT | 7.23 |
| 0.25M KCl | 3.5 mm square CVD | 5.22 |
| 0.25M KCl | 4.1 mm square CVD | 4.84 |
| 0.25M KCl | 4.2 mm square HPHT | 7.64 |
| 0.25M $K_2C_2O_4$ | 4.2 mm square HPHT | 9.10 |
| 0.25 $K_2SO_4$ | 3.5 mm square CVD | 10.26 |
| 0.25 $K_2SO_4$ | 4.1 mm square CVD | 9.84 |
| 0.25 $K_2SO_4$ | 4.2 mm square HPHT FIG. 5 | 12.62 |
| 0.25M $KNO_3$ | 3.5 mm square CVD | 0.36 |
| 0.03M $K_2SO_4$ | 3.5 mm square CVD | 4.92 |
| 0.06M $K_2SO_4$ | 3.5 mm square CVD | 10.22 |
| 0.125M $K_2SO_4$ | 3.5 mm square CVD | 10.36 |
| 0.25M $K_2SO_4$ | 3.5 mm square CVD | 10.26 |

TABLE 1-continued

Etch Rate Comparison

| Solution | Substrate | Etch Rate (mm² hr⁻¹) |
|---|---|---|
| FIG. 6 | | |
| 0.25M K₂SO₄ | 4.1 mm square CVD | 9.84 |
| 0.20M K₂SO₄ and 0.05M H₂SO₄ | 4.1 mm square CVD | 17.82 |
| 0.25M K2SO4 and 0.25M H2SO4 | 4.1 mm square CVD | 16.04 |
| 0.25M H₂SO₄ | 4.1 mm square CVD | 20.96 |
| Temperature (0.05M H₂SO₄) | | |
| 10 | 3.5 mm square HPHT | 4.89 ± 0.79 (n = 3) |
| 30 | 3.5 mm square HPHT | 9.23 ± 2.8 (n = 3) |
| 50 | 3.5 mm square HPHT | 14.97 ± 1.2 (n = 3) |
| 70 | 3.5 mm square HPHT | 42.23 ± 6.9 (n = 3) |

Electron Paramagnetic Resonance (EPR)

Solutions for EPR comprised 0.25 M salt in DI water, including potassium nitrate, potassium chloride, and potassium sulphate ($K_2SO_4$, Analysis Grade, Sigma Aldrich, UK). Sulphuric acid ($H_2SO_4$, 96% Ultrapur, Merck, UK) was used at 0.3% v/v.

Electrolysis of a solution containing 0.05 M $H_2SO_4$, 0.25 M $K_2SO_4$, 0.25 M KCl or 0.25 M $KNO_3$ was performed in a one-compartment cell. 30 V was applied between two platinum electrodes (electrode area, 0.5 cm², with the same geometry as those used in the etch cell) placed in solution using a power supply (Elektro-Automatik GmbH, EA-PS 9750-04). After a period of 15 minutes, approximately 20 mg of 5,5-dimethyl-1-pyrroline-N-oxide (DMPO; Enzo life sciences, USA) was added to the mixture and mixed thoroughly. From the resultant solution, an aliquot of the electrolysis mixture was sampled and the EPR spectrum recorded.

The EPR signals for the DMPO spin adducts were recorded on a X-band spectrometer (EMX; Bruker, Germany) fitted with a HS cylindrical resonator (4119HS/0207; Bruker, Germany) at 298 K. Measurements were performed in a quartz EPR tube with a 1 mm inner diameter (Wilmad® quartz (CFQ) EPR tubes; Sigma-Aldrich, UK). For all measurements, the following spectrometer parameters were used: a non-saturating microwave power of 20 mW; central magnetic field, 3520 G; scan width, 100 G and a modulation amplitude, 0.5 G. All spectra reported are an average of 9 scans. Fitting and simulation of the EPR spectra was performed using the MATLAB package EasySpin (Version 5.2.25, Stoll, S.; Schweiger, A. EasySpin, a Comprehensive Software Package for Spectral Simulation and Analysis in EPR. *J. Magn. Reson.* 2006, 178 (1), 42-55. https://doi.org/10.1016/j.jmr.2005.08.013.).

EXAMPLE 1

The effect of different anions on the bulk etch rate of diamond material containing a damage layer of non-diamond carbon The electrolytes described above, each having a fixed concentration of 0.25 M of the respective anion, were used as the electrolyte in an electrochemical etching process performed on three different diamond materials, specifically a 3.5 mm square CVD diamond material, a 4.1 mm CVD diamond material and a 3.5 mm HPHT diamond material, all of which had been processed as described above to include a damage layer of sp² bonded carbon. The bulk etch rates observed are shown in FIG. 4.

With the exception of $KNO_3$ all the electrolytes offered improved etch rates over published processes. The fastest etching electrolyte was $K_2SO_4$, which had a bulk etch rate over an order of magnitude faster than published processes. This significant increase in bulk etch rate reduces processing times, offering significant savings in process time and cost.

EXAMPLE 2

The effect of sulfate ion concentration on bulk etch rates of diamond material containing a damage layer of sp² bonded carbon.

Having established that advantageous bulk etch rates were observed when using a electrolyte which comprises sulfate ions, Example 2 was carried out to investigate the effect of sulfate ion concentration on bulk etch rate.

The bulk etch rate in solutions of $K_2SO_4$ wherein the concentration of sulfate ($SO_4^{2-}$) varied in the range from 0.03 to 0.25 M was measured. The data for 0.25 M $KNO_3$ was included for comparison (0 M sulfate ions) as this had the slowest bulk etch rate of those measured in Example 1. The conductivity of the 0.25 M $KNO_3$ solution was 25 mS cm⁻¹, with the conductivity of the sulfate solutions carrying from 4 to 40 mS cm⁻¹ across the range. The results are presented in FIG. 5.

It is clear from FIG. 5 that at sulfate ion concentrations up to 0.06 M, there is a linear increase in the bulk etch rate with increasing sulfate concentration. The bulk etch rate then plateaus above sulfate ion concentrations of greater than 0.06 M but at a bulk etch rate which is significantly faster than has previously been achieved. The initial linear relationship is likely as a result of an increased sulfate ion concentration at the electrode surface, which ultimately results in a higher number of active etchant species being produced, thus supporting the hypothesis in Example 1 that sulfate ions are involved directly in the generation of the active etchant species.

The plateau in the bulk etch rate can be explained by one or a combination of two factors. First, the concentration of active etchant species at the damage layer interface increases such that the active sites within the damage layer become the rate-limiting step for etching. Second, at higher active etchant species concentrations, the chances of these species combining increases such that the number of active etchant species at the damage layer interface does not actually increase above 0.06 M.

As no additional electrolyte was added as the concentration of the $K_2SO_4$ solution was increased, the conductivity of the electrolyte also increases. However, in the region between 60 to 250 mM sulfate ions, there is no noticeable change in rate despite the conductivity increasing from 4 to 42 mS cm⁻¹. This suggests that conductivity has little effect on bulk etch rate in this regime.

EXAMPLE 3

The effect of pH on bulk etch rates of diamond material containing a damage layer comprising sp² bonded carbon To further increase bulk etch rates of diamond material, the effect of pH on sulfate ion-containing electrolyte solutions was investigated. A mixture of $K_2SO_4$ and $H_2SO_4$ was used to vary the pH while maintaining a total sulfate ion concentration of 0.25 M.

The results are presented in FIG. 6.

It was found that a decrease in pH, and its associated increase in conductivity (42 to 89 mS cm$^{-1}$) has the effect of increasing the bulk etch rate. However, as shown in Example 2, changes in conductivity have little effect on the bulk etch rate and so the increase in bulk etch rate can be attributed to the decrease in pH.

The bulk etch rate observed showed a general upward trend with increasing proton (H$^+$) concentration suggesting that protons are also involved in the rate limiting step. In particular, the factor 2 increase in the bulk etch rate upon decreasing the pH from 7 to 0.8 demonstrates clearly that the use of more acidic solutions as electrolytes offers further advantageous improvements in the bulk etch rate.

EXAMPLE 4

The use of single crystal boron doped diamond (BDD) instead of optical grade single crystal diamond To investigate whether the approach extends to doped diamond material we investigated the electrochemical etching of 5 mm$^2$ CVD single crystal diamond material doped with ~10$^{19}$ boron atoms cm$^{-3}$. This material was implanted an annealed in the same fashion as all the other material discussed.

Figure 7:
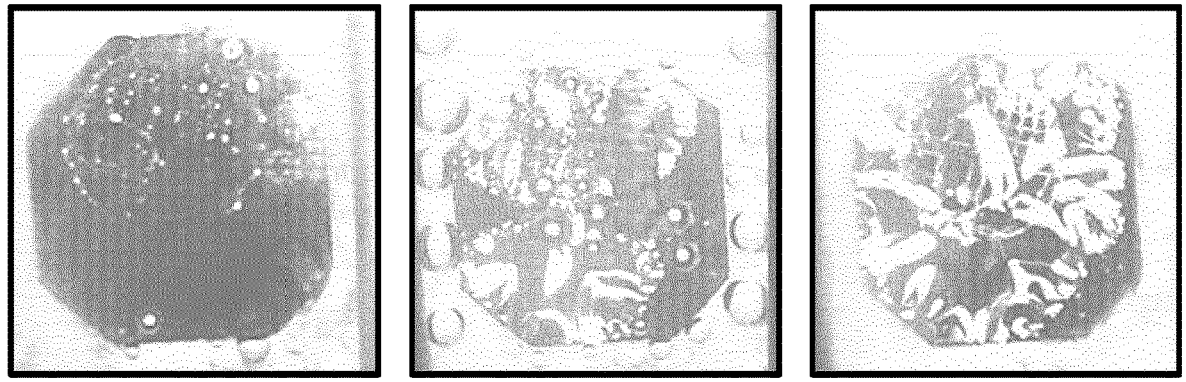
FIG. 7 shows microscope images of the etching of boron doped polycrystalline diamond. Each image is separated by 25 minutes of etching from t=0, as described in Example 4.

Although it is difficult to process the optical etch data in the normal fashion, due to the less significant colour change, it is obvious by eye that the sp$^2$ bonded carbon layer is being removed, as seen in FIG. 7. Full separation of the 5 mm$^2$ plate was achieved in 60 minutes in a 0.25 M H$_2$SO$_4$ solution, giving a comparable separation time to non-doped material.

EXAMPLE 5

The use of polycrystalline optical grade material instead of single crystal optical grade material To investigate whether the approach extends to polycrystalline diamond material we investigated the electrochemical etching of 4 mm square CVD optical grade polycrystalline material. This material was implanted an annealed in the same fashion as all the other material discussed.

Figure 9:
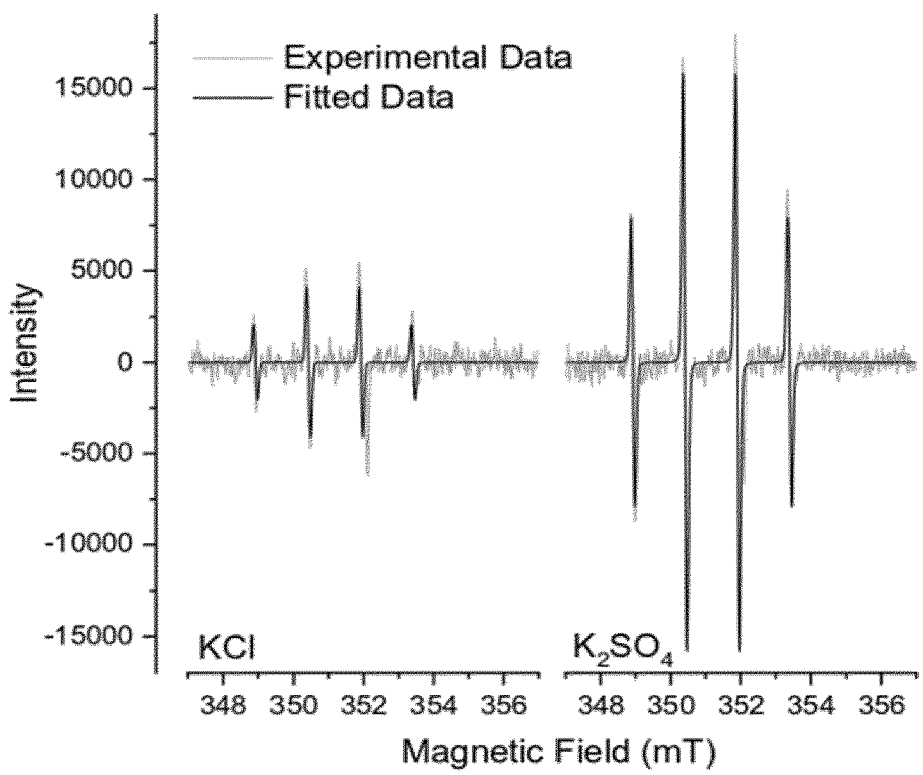
FIG. 9 shows Electron Paramagnetic Resonance (EPR) data for various salt solutions after electrolysis.

It is obvious by eye that the sp$^2$ bonded carbon layer is being removed, as seen in FIG. 9. Full separation of the 4 mm square plate was achieved in 60 minutes in a 0.25 M H$_2$SO$_4$ solution, giving a comparable separation time to non-doped material.

EPR measurements were obtained from different salt solutions after electrolysis as described above in order to determine the presence of the hydroxyl radical. It is thought that the presence of the hydroxyl radical has an effect on the etching rate of the damage layer. FIG. 9 shows the experimental and fitted data for potassium chloride and potassium sulphate solutions. The peaks shown in the three traces of FIG. 9 are indicative of the hydroxyl radical, and the areas under the peaks are indicative of the quantity of hydroxyl radicals present.

It can be seen from FIG. 9 that the sulphate solution formed far more hydroxyl radicals than the chloride solution. This corresponds with the etch rates shown in FIG. 4, in which diamond in the sulphate solution has a faster etch rate than diamond in the chloride solution.

Figure 10:
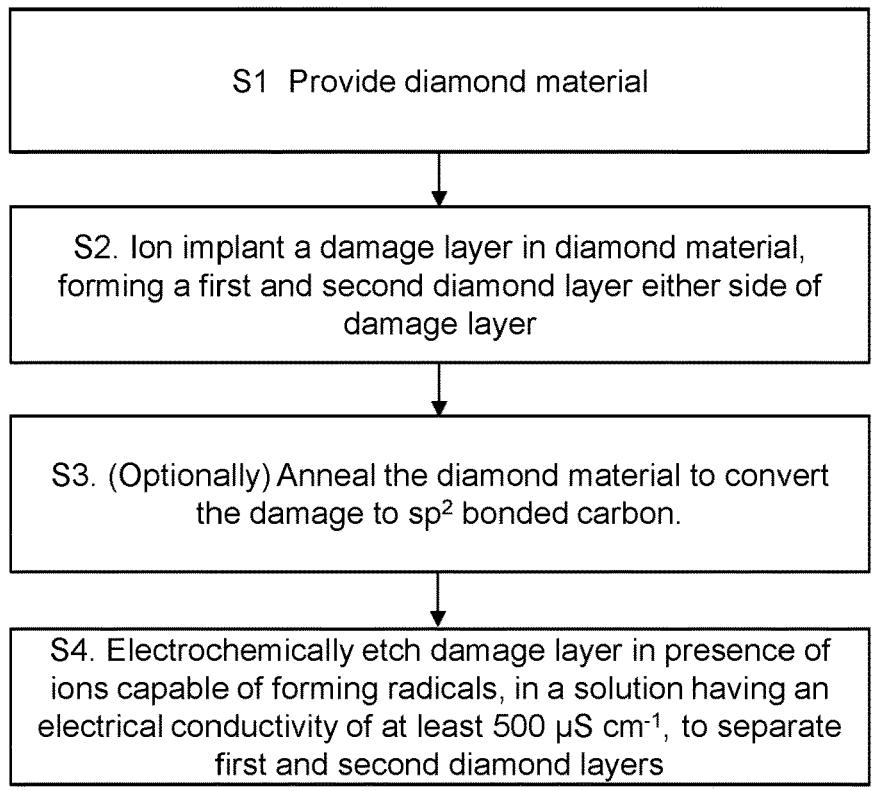
FIG. 10 is a flow diagram showing exemplary steps for forming a diamond product.

Exemplary steps of the method are show in FIG. 10. The following numbering corresponds to that of FIG. 9:

S1. Diamond material is provided. This may be single crystal or polycrystalline diamond material. If it is single crystal diamond material, it may be natural or HPHT diamond material. Furthermore, the diamond material may be doped, for example with any of nitrogen, boron, phosphorus, and silicon.

S2. The diamond material is ion implanted so as to form a damage layer comprising sp$^2$ bonded carbon, wherein the presence of the damage layer defines a first diamond layer above and in contact with the damage layer and a second diamond layer below and in contact with the damage layer.

S3. As an optional step, the diamond material may be annealed in order to increase the amount of sp$^2$ carbon in the damage layer.

S4. The damage layer is electrochemically etched in the presence of ions capable of forming radicals during the etching process. The etching of the damage layer allows the first and second layers to separate. Suitable ions include, but are not limited to, persulfate ions, sulfate ions, oxalate ions, chloride ions, carbonate ions and metal ions.

Figure 11:
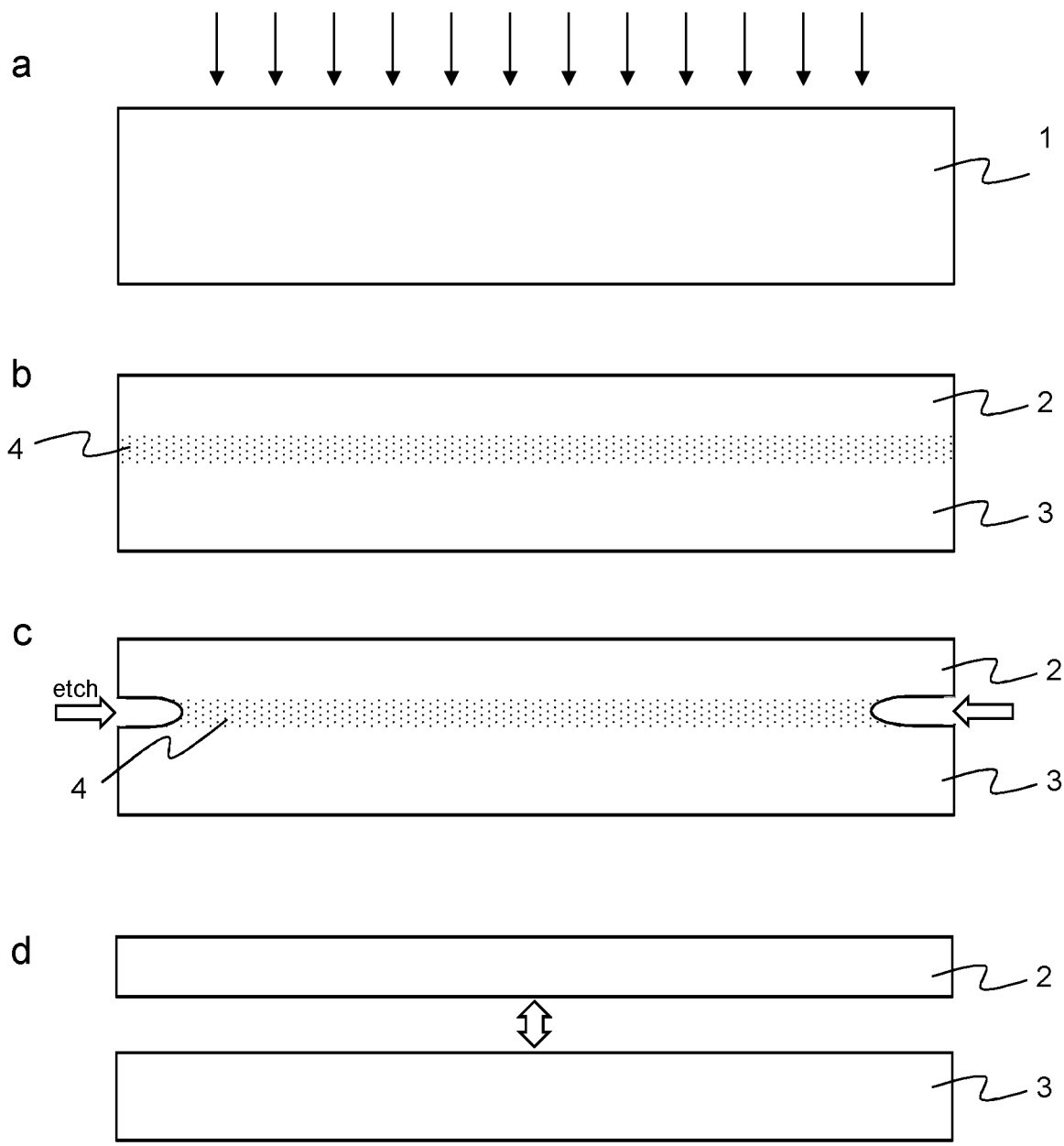
FIG. 11 illustrates schematically exemplary steps for forming the diamond product.

Turning now to FIG. 11, some of the steps of FIG. 10 are illustrated schematically (and not to scale).

FIG. 11a shows a provided diamond material 1, which is subjected to ion implantation.

FIG. 11b shows a first diamond layer 2 and a second diamond layer 3, each separated by a damage layer 4 comprising sp$^2$ bonded carbon, formed during the ion implantation step.

FIG. 11c shows electrochemical etching in the presence of ions capable of forming radicals during electrolysis. The electrochemical etching preferentially attacks the damage layer 4.

FIG. 11d shows the damage layer 4 having been etched away, allowing the separation of the first layer 2 from the second layer 3.

When removing a separated layer from the damage layer, the separated layer can be very thin, and difficult to handle without introducing damage to the separated layer. One way to address this issue is to provide a support structure, such as one described in WO 2016/058037, in which a support structure is attached to the diamond material by gluing, brazing, overgrowing polycrystalline diamond, or any suitable means, provided that means is capable of surviving the etching process. For example, a mask made from a material such as diamond may be glued to the diamond material, which allows the separated layer, once removed, to be easily handled.

When preparing thin plates of polycrystalline CVD diamond, the present invention allows such plates to have a larger average lateral grain size and lower sp$^2$ carbon quantity than was previously possible. A plate of polycrystalline CVD diamond material usually comprises a nucleation face (the face at which CVD growth started) which comprises small grains of diamond material and significant quantities of non-diamond sp2 carbon (detectable via Raman spectroscopy); and a growth face, which comprises larger grains of diamond material and, if growth conditions are controlled correctly, a lower quantity of non-diamond sp$^2$ carbon. Diamond grain size increases on moving through such a wafer of polycrystalline CVD diamond material from the nucleation face to the growth face.

Using prior art techniques to obtain thin plates of polycrystalline CVD diamond, thin plates are grown directly on a substrate and therefore formed close to the nucleation face. Such plates have a small average lateral grain size and relatively high sp$^2$ carbon content.

A relatively thick plate can be grown with the growth face having a large average lateral grain size and a low sp2 carbon content. Using the techniques described above, a layer can be removed from the growth surface, leaving a thin layer with a relatively high (greater than 5 μm) average lateral grain size and a thickness of no more than 30 μm. The average lateral grain size may be greater than 10 μm, greater than 15 μm, greater than 20 μm.

The average lateral grain size of a polycrystalline CVD diamond surface was measured using scanning electron microscopy (SEM). SEM images of a surface of a polycrystalline CVD diamond material indicate boundaries between grains such that individual grains can be identified and counted. Accordingly, an area of the polycrystalline CVD diamond surface can be imaged using SEM, the total number of diamond grains along a line across the image can then be counted, and then the line length can be divided by the number of grains along the line to obtain and an average lateral grain size. A number of lines across the SEM image can be analysed in this manner, optionally in perpendicular directions, and an average value calculated for the lateral grain size across the imaged area.

While this invention has been particularly shown and described with reference to embodiments, it will be understood to those skilled in the art that various changes in form and detail may be made without departing from the scope of the invention as defined by the appendant claims.

The invention claimed is:

1. A method for forming a diamond product comprising:
providing a diamond material;
forming a damage layer comprising $sp^2$ bonded carbon, wherein a presence of the damage layer defines a first diamond layer above and in contact with the damage layer and a second diamond layer below and in contact with the damage layer; and
electrochemically etching the damage layer to separate therefrom the first layer, wherein the electrochemical etching is performed in a solution containing ions, the solution having an electrical conductivity of at least 500 μS cm$^{-1}$, and wherein the ions are capable of forming radicals during electrolysis.

2. The method according claim 1, wherein the ions are selected from any of persulfate ions, sulfate ions, oxalate ions, chloride ions, carbonate ions and metal ions.

3. The method according to claim 1, wherein the etching occurs at an etch rate selected from any of at least 2 mm$^2$ hr$^{-1}$, at least 5 mm$^2$ hr$^{-1}$, at least 10 mm$^2$ hr$^{-1}$, 20 mm$^2$ hr$^{-1}$, 30 mm$^2$ hr$^{-1}$, and at least 40 mm$^2$ hr$^{-1}$.

4. The method according to claim 1, wherein etch rate is measured by aligning the diamond material comprising the damage layer with electrodes in an electrochemical cell to allow imaging of the diamond material and monitoring a material loss of the diamond material over time.

5. The method according to claim 1, wherein the electrochemical etching is performed in an electrochemical cell comprising at least an anode, a cathode and an electrolyte, and the ions are present in the electrolyte.

6. The method according to claim 5, wherein the ions are present during the electrochemical etching at a concentration of between 0.01 M and an upper limit of the solubility of the ions in the electrolyte.

7. The method according to claim 1, wherein the electrochemical etching is performed at a temperature selected from any of at least 50° C., at least 70° C. and at least 90° C.

8. The method according to claim 1, wherein the first and second diamond layers comprise diamond formed by chemical vapour deposition (CVD).

9. The method according to claim 1, wherein the diamond material is single crystal diamond material.

10. The method according to claim 9, wherein the single crystal diamond material has a largest linear dimension selected from any of at least 6 mm, at least 8 mm, at least 10 mm, at least 15 mm and at least 20 mm.

11. The method according to claim 1, wherein the diamond material is polycrystalline diamond material.

12. The method according to claim 1, wherein the diamond material comprises diamond produced by any of a chemical vapour deposition, CVD, process and a high pressure high temperature, HPHT, process.

13. The method according to claim 1, wherein the diamond material is doped.

14. The method according to claim 13, wherein the diamond material is doped with any of nitrogen, boron, phosphorus, and silicon.

15. The method according to claim 1, wherein the damage layer comprises graphitic material.

16. The method according to claim 1, further comprising forming the damage layer by an ion implantation process.

17. The method according to claim 1, further comprising attaching a support structure to a surface of the diamond material prior to the step of electrochemically etching the damage layer, wherein the support structure and a means of attaching the support structure are formed from materials that are substantially inert to a solution in which the electrochemical etching occurs.

18. A diamond product obtained by the method according to claim 1.

19. The diamond product according to claim 18, wherein the diamond product comprises any of single crystal diamond material, polycrystalline diamond material, boron-doped single crystal diamond material and boron-doped polycrystalline diamond material.

20. Use of the diamond product according to claim 18 in any of an optical product, an electronic product and an electrochemical product.

* * * * *